(12) United States Patent
Zhang et al.

(10) Patent No.: US 9,281,326 B2
(45) Date of Patent: Mar. 8, 2016

(54) ARRAY SUBSTRATE AND MANUFACTURING METHOD THEREOF AND DISPLAY PANEL

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Pengju Zhang, Beijing (CN); Yu Zhao, Beijing (CN); Zilong Gao, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/568,640

(22) Filed: Dec. 12, 2014

(65) Prior Publication Data

US 2015/0372018 A1  Dec. 24, 2015

(30) Foreign Application Priority Data

Jun. 24, 2014  (CN) .......................... 2014 1 0286328

(51) Int. Cl.
   *H01L 27/12* (2006.01)
(52) U.S. Cl.
   CPC ............ *H01L 27/127* (2013.01); *H01L 27/124* (2013.01)
(58) Field of Classification Search
   USPC .......................................................... 438/48
   See application file for complete search history.

(56) References Cited

U.S. PATENT DOCUMENTS

| | | | | |
|---|---|---|---|---|
| 2005/0227399 A1* | 10/2005 | Hayase | ............... | G02F 1/13463 438/48 |
| 2012/0009742 A1* | 1/2012 | Yamazaki | ......... | H01L 21/67017 438/158 |
| 2012/0021570 A1* | 1/2012 | Tajima | .................. | C30B 25/105 438/157 |
| 2012/0052637 A1* | 3/2012 | Komatsu | ............. | H01L 21/0245 438/157 |
| 2012/0146143 A1* | 6/2012 | Kang | ................ | H01L 21/76804 257/347 |
| 2012/0292620 A1* | 11/2012 | Tsou | ................... | H01L 27/1288 257/57 |
| 2014/0367705 A1* | 12/2014 | Bibl | ....................... | H01L 33/44 257/88 |

* cited by examiner

*Primary Examiner* — Asok K Sarkar
(74) *Attorney, Agent, or Firm* — Nath, Goldberg & Meyer; Joshua B. Goldberg

(57) ABSTRACT

The invention provides an array substrate, a method for manufacturing the array substrate, and a display panel, the array substrate includes a plurality of thin film transistors, and the method includes: S1. preparing a base substrate on which sources and drains of the thin film transistors are formed; S2. forming an insulation layer on the base substrate such that the insulation layer includes spacer regions and a plurality of strip-shaped electrode regions, and every two adjacent strip-shaped electrode regions are separated from each other by the spacer region; S3. forming a spacer layer on the spacer regions of the insulation layer; S4. forming a pattern including strip-shaped electrodes on the strip-shaped electrode regions of the insulation layer; S5. peeling off the spacer layer on the spacer region. The invention can prevent every two adjacent strip-shaped electrodes from interconnecting due to etching residues, so as to improve product performance.

18 Claims, 2 Drawing Sheets

ARRAY SUBSTRATE AND MANUFACTURING METHOD THEREOF AND DISPLAY PANEL

CROSS-REFERENCE TO RELATED APPLICATION AND CLAIM OF PRIORITY

This application claims priority to and the benefit of Chinese invention Application No. 201410286328.4 filed on Jun. 24, 2014 and titled "Array Substrate and Manufacturing Method thereof and Display Panel", which is incorporated herein by reference in its entirety.

FIELD OF THE INVENTION

The present invention relates to the field of display technology, in particular to an array substrate and a manufacturing method thereof, and a display panel.

BACKGROUND OF THE INVENTION

Currently, an array substrate of a thin Film Transistor Liquid Crystal Display (TFT-LCD) is manufactured by several patterning processes, wherein each patterning process may includes photoresist applying, exposure, development, etching and peeling off etc.

The array substrate is generally manufactured by four, five or six patterning processes. For example, the method for manufacturing the array substrate by five patterning processes includes:

First, a gate metal material is deposited on a base substrate 1, and a pattern of gates 2 is formed by a first patterning process, as shown in FIG. 1;

Second, an insulation material (e.g. SiNx) is deposited so as to separate the gates 2 from a semiconductor layer to be formed subsequently, a semiconductor material a-Si is then deposited on the insulation material, and a pattern of a gate insulation layer 3 and a pattern of a semiconductor layer 4 are formed by a second patterning process, as shown in FIG. 2;

Third, a source and drain metal material is deposited, and a pattern including sources 5 and drains 6 is formed by a third patterning process, as shown in FIG. 3;

Then, an insulation material is deposited to form an insulation layer 7 (e.g. a passivation layer, PVX), and via holes 8 are formed in the insulation layer 7 by a fourth patterning layer, as shown in FIG. 4;

Finally, a transparent electrode material (i.e. an ITO thin film) is deposited, and a pattern of pixel electrodes 9 is formed by a fifth patterning process to form the array substrate, as shown in FIG. 5.

When the pixel electrodes 9 are formed by etching the ITO thin film, etching residues 10 are likely to be generated (as shown in FIG. 5), which will easily cause interconnection between two adjacent pixel electrodes.

SUMMARY OF THE INVENTION

An object of the present invention is to provide as method for manufacturing an array substrate, an array substrate manufactured by the method, and as display panel including the array substrate, which can prevent the etching residues, generated when the pixel electrodes are formed, from causing interconnection between the pixel electrodes, so as to improve the product quality.

In order to achieve the object, the present invention provides a method for manufacturing an array substrate, wherein the array substrate includes a plurality of thin film transistors, and the method for manufacturing an array substrate includes steps of:

preparing a base substrate, on which sources and drains of thin film transistors are formed;

forming an insulation layer on the base substrate, so that the insulation layer includes a plurality of spacer regions and a plurality of strip-shaped electrode regions, and every two adjacent strip-shaped electrode regions are separated from each other by the spacer region;

forming a spacer layer on the spacer regions of the insulation layer;

forming a pattern including strip-shaped electrodes on the strip-shaped electrode regions of the insulation layer; and peeling off the spacer layer on the spacer regions.

Optionally, the spacer layer is made of photoresist.

Optionally, the step of forming a spacer layer on the spacer regions of the insulation layer includes:

applying photoresist on the insulation layer; and forming the spacer layer by a patterning process.

Optionally, the strip-shaped electrodes include pixel electrodes or common electrodes.

Optionally, the strip-shaped electrode regions of the insulation layer include via hole sub-regions for forming via holes, and the step of forming the spacer layer by a patterning process includes steps of:

performing an exposure and a development on the photoresist so that the photoresist at the via hole sub-regions are removed after the development is performed and the thickness of the photoresist at the spacer regions is larger than that of the photoresist at the strip-shaped electrode regions; and performing an ashing process on the photoresist so as to remove the photoresist at the strip-shaped electrode regions, and remain the photoresist at the spacer regions to form the spacer layer.

Optionally, after the step of performing an exposure and a development on the photoresist, the thickness of the photoresist at the spacer regions is in the range of 1.5 μm to 2 μm, and the thickness of the photoresist at the strip-shaped electrode regions is in the range of 0.3 μm to 1.0 μm.

Optionally, during the step of performing an exposure on the photoresist, a halftone mask plate is used to perform the exposure on the photoresist, and wherein fully light transmissive regions of the halftone mask plate correspond to the via hole sub-regions, light semi-transmissive regions of the halftone mask plate correspond to the strip-shaped electrode regions, and light non-transmissive regions of the halftone mask plate correspond to the spacer regions.

Optionally, after the step of performing an exposure and a development on the photoresist and before the step of performing an ashing process on the photoresist, the method for manufacturing an array substrate further includes steps of:

performing an etching process on the via hole sub-regions of the insulation layer to form the via holes so that a part of the drains of the thin film transistors is exposed.

Optionally, the step of forming a pattern including strip-shaped electrodes on the strip-shaped electrode region of the insulation layer includes:

forming a layer of pixel electrode material which is connected to the drains of the thin film transistors through the via holes; and forming a pattern including pixel electrodes by a patterning process.

Optionally, the insulation layer includes silicon nitride.

Accordingly, the present invention further provides an array substrate, which is manufactured by the above method for manufacturing an array substrate.

Accordingly, the present invention further provides a display panel including the above array substrate.

In the method for manufacturing an array substrate of the present invention, every two adjacent strip-shaped electrode regions are separated from each other by a spacer region of the insulation layer, and a spacer layer is formed on the spacer regions, so that when strip-shaped electrodes are formed on the strip-shaped electrode regions, the etching residues generated during the etching process will adhere to the spacer layer and will be removed later when the spacer layer is peeled off by a subsequent process, thus avoiding the phenomenon that interconnection between strip-shaped electrodes may occur due to the etching residues, and improving the product performance.

BRIEF DESCRIPTION OF THE DRAWINGS

Accompanying drawings are used to provide a further understanding of the invention, constitute a part of the specification, and are used to illustrate the invention in conjunction with the following embodiments, and however, the accompanying drawings will not limit the invention. In the drawings.

DETAILED DESCRIPTION OF THE EMBODIMENTS

Figure 1:
FIG. 1 is a schematic diagram of a structure in which gates are formed on a base substrate in the prior art.
Figure 2:
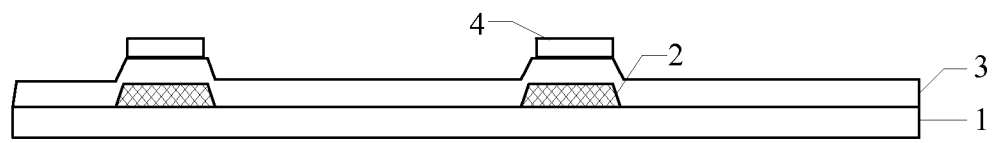
FIG. 2 is a schematic diagram of a structure m which a gate insulation layer and a semiconductor layer are formed on the base substrate in the prior art.
Figure 3:
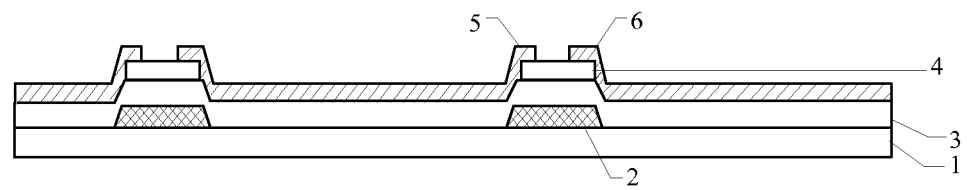
FIG. 3 is a schematic diagram of a structure in which sources and drains are formed on the base substrate in the prior art.
Figure 4:
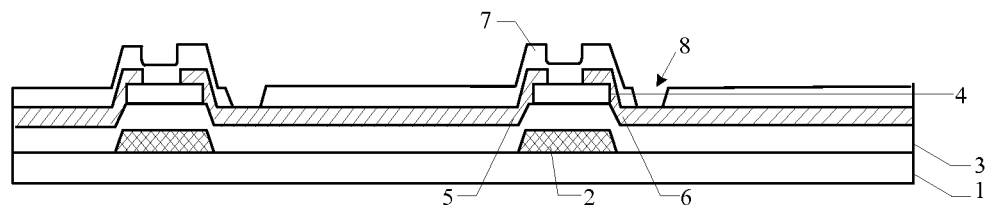
FIG. 4 is a schematic diagram of a structure in which via holes are formed in he prior art.
Figure 5:
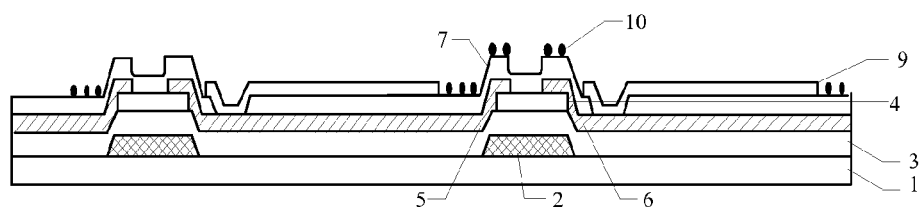
FIG. 5 is a schematic diagram of a structure in which pixel electrodes are formed on the base substrate in the prior art.

In the following, embodiments of the present invention will be described clearly and completely in conjunction with the accompanying drawings. It should be understood that, the embodiments described herein are only used to describe and illustrate the invention, and are not used to limit the invention.

In one aspect of the present invention, there is provided a method for manufacturing an array substrate, the array substrate includes a plurality of thin film transistors, and as shown in FIGS. 6 to 9, the method for manufacturing an array substrate may include:

S1. preparing a base substrate 1, on which sources 5 and drains 6 of thin film transistors are formed;

S2. forming an insulation layer 7 on the base substrate 1, so that the insulation layer 7 includes a plurality of spacer regions and a plurality of strip-shaped electrode regions, and every two adjacent strip-shaped electrode regions are separated from each other by the spacer region.

S3. forming a spacer layer 11 on the spacer regions of the insulation layer 7;

S4. forming a pattern including strip-shaped electrodes on the strip-shaped electrode regions of the insulation layer 7; and S5. peeling off the spacer layer on the spacer regions.

In the present invention, the spacer regions of the insulation layer 7 separates every two adjacent strip-shaped electrode regions from each other, and the spacer layer 11 is formed on the spacer regions, so that when strip-shaped electrodes are formed on the strip-shaped electrode regions, the etching residues 10 generated during the etching process will adhere to the spacer layer 11 and will be removed together with the spacer layer when the spacer layer is peeled off, thus avoiding the phenomenon that interconnection between strip-shaped electrodes may occur due to the etching residues 10, and improving the product performance.

In the present invention, every "strip-shaped electrode" may include a plurality of electrode strips which are electrically connected to each other. In the step S2, "every two adjacent strip-shaped electrode regions are separated from each other by the spacer region" does not mean "the spacer region is located between two adjacent electrode strips of the same "strip-shaped electrode"". In the present invention, the "strip-shaped electrode" may function as a common electrode, or a pixel electrode.

Figure 6:
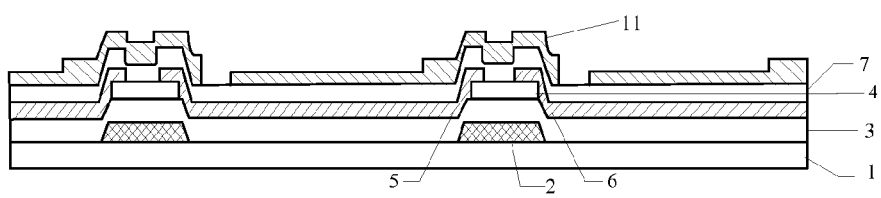
FIG. 6 is a schematic diagram of a structure formed after an exposure and a development are performed on photoresist in an embodiment of the invention.

As shown in FIG. 6, the thin film transistor may include a gate 2, a gate insulation layer 3, a semiconductor layer 4, a source 5 and a drain 6. Generally, a gate metal film layer may be first formed on the base substrate 1, and a pattern including the gate 2 is formed by a first patterning process; an insulation film layer and a semiconductor film layer are then formed on the base substrate, and patterns of the gate insulation layer and the semiconductor layer are simultaneously formed by a second patterning process; a source and drain metal film layer is then formed on the base substrate 1 again, and a pattern including the source 5 and the drain 6 is formed by a third patterning process. The various film layers may be formed on the base substrate 1 by various methods, such as coating, chemical vapor deposition (CVD), sputtering, evaporation, etc. A gate line on the array substrate, which is connected to the gate of the thin film transistor, may be formed simultaneously with the gate 2, and a data line connected to the source 5 of the thin film transistor may he formed simultaneously with the source 5 and the drain 6.

Optionally, the spacer layer 11 is made of photoresist, and in this case, the step S3 may include:

S31. applying photoresist on the insulation layer 7; and

S32. forming the spacer layer 11 by a patterning process.

Particularly, photoresist is first applied on the spacer regions and the strip-shaped electrode regions of the insulation layer 7. The photoresist may be positive or negative photoresist. Taking the positive photoresist as an example, the positive photoresist is exposed by using a mask plate, the opening regions of which correspond to the strip-shaped electrode regions, so that the positive photoresist on the strip-shaped electrode regions are modified; then the photoresist on the strip-shaped electrode regions is removed by using a liquid developer, and the photoresist on the spacer regions is remained to form the spacer layer 11.

In the present invention, the strip-shaped electrode may function as a pixel electrode, or a common electrode. As an example of the present invention, the strip-shaped electrode is a pixel electrode 9.

Figure 7:
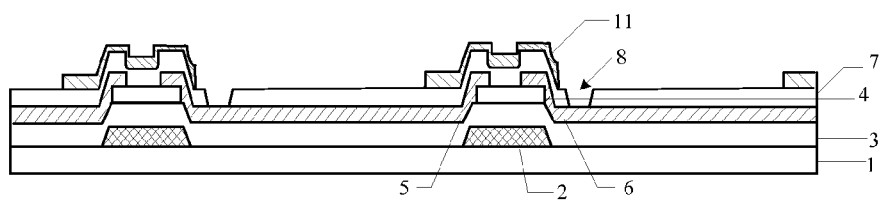
FIG. 7 is a schematic diagram of a structure illustrating a spacer layer is formed in the embodiment of the invention.

When the strip-shaped electrode is the pixel electrode 9, in order to connect the pixel electrode 9 to the drain 6 of the thin film transistor, a via hole 8 may be first formed in the insulation layer 7 to expose a part of the drain 6 for connecting the pixel electrode 9. The strip-shaped electrode region of the insulation layer 7 includes a via hole sub-region for forming the via hole 8, and in this case, the step S32 may include:

S321. performing an exposure and a development on the photoresist so that the photoresist at the via hole sub-region is removed, and the thickness of the photoresist at the spacer region is larger than that of the photoresist at the strip-shaped electrode region, after the development is performed (as shown in FIG. 6);

S322. performing an etching on the via hole sub-region of the insulation layer 7 to form the via hole 8 so that a part of the drain 6 of the thin film transistor is exposed (as shown in FIG. 7); and S323. performing an ashing process on the photoresist to remove the photoresist at the strip-shaped electrode regions, and remain the photoresist at the spacer region to form the spacer layer 11 (as shown in FIG. 7).

Optionally, in the step S321, after the development is performed, the thickness of the photoresist at the spacer region is in the range of 1.5 μm to 2.0 μm, and the photoresist at the strip-shaped electrode region is in the range of 0.3 μm to 1.0 μm.

In order to facilitate the formation of the photoresist with different thicknesses, in the step S321, a halftone mask plate is used to perform the exposure. Fully light transmissive regions of the halftone mask plate correspond to the via hole sub-regions, light semi-transmissive regions of the halftone mask plate correspond to the strip-shaped electrode regions, and light non-transmissive region of the halftone mask plate correspond to the spacer regions.

Taking the positive photoresist as an example, the fully light transmissive regions of the halftone mask plate can make light fully transmit, and the light semi-transmissive region is provided with a partially light transmissive grating structure. During the exposure process, the photoresist at the via hole sub-regions corresponding to the fully light transmissive region of the halftone mask plate is fully irradiated by light to be completely modified and will he removed completely after being performed a development; the photoresist at the strip-shaped electrode regions corresponding to the partially light transmissive regions (i.e. the light semi-transmissive region) of the halftone mask plate receive relatively little irradiation which is not enough to make the photoresist completely modified, so as to be partially dissolved by the liquid developer and partially remained on the strip-shaped electrode regions; the spacer regions corresponding to the blocking regions (i.e. the light non-transmissive region) of the halftone mask plate are not irradiated by light so as not to be modified, and will be completely remained on the spacer regions after the development is performed.

Since the photoresist at the via hole sub-regions is removed by the liquid developer, the insulation layer 7 at the via hole sub-regions may be removed by using corrosive liquid, gas, etc.

Figure 8:
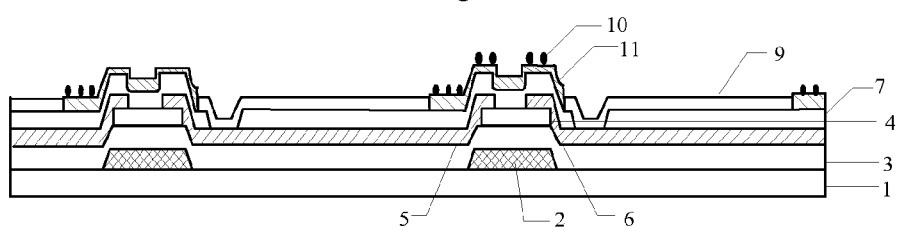
FIG. 8 is a schematic diagram of a structure in which pixel electrodes are formed in the embodiment of the invention.

Further, the step S4 may include:

S41. forming a layer of pixel electrode material so that the layer of pixel electrode material is connected to the drain 6 of the thin film transistor by the via hole 8; and S42. forming a pattern including the pixel electrode 9 by a patterning process (as shown in FIG. 8).

The layer of pixel electrode material is a layer of transparent conductive material, and optionally, the layer of pixel electrode material is an indium tin oxide (ITO) film.

Figure 9:
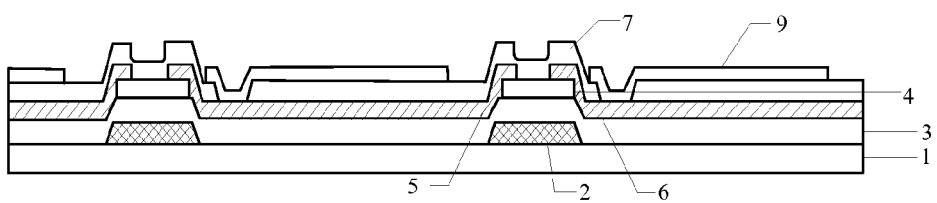
FIG. 9 is a schematic diagram of a structure of an array substrate in the embodiment of the invention.

Particularly, the photoresist may be applied on the ITO film, and then may be performed an exposure and a development to make the photoresist on the strip-shaped electrode regions remained, and the ITO film on the spacer regions without being protected by the photoresist is then etched away, thus the etching residues generated may adhere to the spacer layer on the spacer regions, and finally, the spacer layer 11 (i.e. the photoresist) on the spacer regions is peeled off (as shown in FIG. 9). Since the spacer layer is made of photoresist, the photoresist on the spacer regions may be removed together with the photoresist on the strip-shaped electrode regions.

The insulation layer on the source and the drain in the present invention may include silicon nitride (SiNx), for protecting the data line.

The method for manufacturing an array substrate provided by the invention described above, wherein every two adjacent strip-shaped electrode regions are separated from each other by the spacer region of the insulation layer 7 and the spacer layer 11 is formed on the spacer regions. Thus, when the strip-electrodes are formed on the strip-shaped electrode regions of the insulation layer 7, the etching residues 10 generated during the etching process may adhere to the spacer layer 11, When the spacer layer 11 is peeled off, the etching residues 10 may be removed together, so that the phenomenon that interconnection between any two adjacent strip-shaped electrodes may occur due to the etching residues 10 is avoided, and the product performance is improved.

In another aspect of the present invention, there is farther provided an array substrate manufactured by the above method for manufacturing an array substrate. In the array substrate, there is no etching residue between two adjacent strip-shaped electrodes, and the two adjacent strip-shaped electrodes have good insulation therebetween, thus improving the display quality of the display panel including the array substrate.

In yet another aspect, there is provided a display panel including the above array substrate.

It should be understood that, the above descriptions are merely specific embodiments of the present invention, and however, the invention is not limited thereto. Variations and improvements may be made by persons skilled in the an without departing from the script and substance of the invention, and these variations and improvements should be considered to be within the protection scope of the invention.

The invention claimed is:

1. A method for manufacturing an array substrate, wherein the array substrate includes a plurality of thin film transistors, and the method for manufacturing an array substrate includes steps of:
    preparing a base substrate, on which sources and drains of thin film transistors are formed;
    forming an insulation layer on the base substrate, so that the insulation layer includes a plurality of spacer regions and a plurality of strip-shaped electrode regions, and every two adjacent strip-shaped electrode regions are separated from each other by the spacer region;
    forming a spacer layer on the spacer regions of the insulation layer;
    forming a pattern including strip-shaped electrodes on the strip-shaped electrode regions of the insulation layer; and
    peeling off the spacer layer on the spacer region.

2. The method for manufacturing an array substrate according to claim 1, wherein the spacer layer is made of photoresist.

3. The method for manufacturing an array substrate according to claim 2, wherein the strip-shaped electrodes include pixel electrodes or common electrodes.

4. The method for manufacturing an array substrate according to claim 2, wherein the insulation layer includes silicon nitride.

5. The method for manufacturing an array substrate according to claim 2, wherein the step of forming a spacer layer on the spacer regions of the insulation layer includes:
   applying photoresist on the insulation layer; and
   forming the spacer layer by a patterning process.

6. The method for manufacturing an array substrate according to claim 5, wherein the strip-shaped electrode regions of the insulation layer include via hole sub-regions for forming via holes, and the step of forming the spacer layer by a patterning process includes steps of:
   performing an exposure and a development on the photoresist so that the photoresist at the via hole sub-regions are removed after the development is performed, and the thickness of the photoresist at the spacer regions is larger than that of the photoresist at the strip-shaped electrode regions; and
   performing an ashing process on the photoresist so as to remove the photoresist at the strip-shaped electrode regions, and remain the photoresist at the spacer regions to form the spacer layer.

7. The method for manufacturing an array substrate according to claim 6, wherein, after the step of performing an exposure and a development on the photoresist, the thickness of the photoresist at the spacer regions is in the range of 1.5 µm to 2 µm, and the thickness of the photoresist at the strip-shaped electrode regions is in the range of 0.3 µm to 1.0 µm.

8. The method for manufacturing an array substrate according to claim 7, wherein during the step of performing an exposure on the photoresist, a halftone mask plate is used to perform the exposure on the photoresist, and wherein fully light transmissive regions of the halftone mask plate correspond to the via hole sub-regions, light semi-transmissive regions of the halftone mask plate correspond to the strip-shaped electrode regions, and light non-transmissive regions of the halftone mask plate correspond to the spacer regions.

9. The method for manufacturing an array substrate according to claim 7, wherein after the step of performing an exposure and a development on the photoresist and before the step of performing an ashing process on the photoresist, the method for manufacturing an array substrate further includes steps of:
   performing an etching process on the via hole sub-regions of the insulation layer to form the via holes so that a part of the drains of the thin film transistors is exposed.

10. The method for manufacturing an array substrate according to claim 9, wherein the step of forming a pattern including strip-shaped electrodes on the strip-shaped electrode regions of the insulation layer includes:
    forming a layer of pixel electrode material which is connected to the drains of the thin film transistors through the via holes; and
    forming a pattern including pixel electrodes by a patterning process.

11. The method for manufacturing an array substrate according to claim 6, wherein during the step of performing an exposure on the photoresist, a halftone mask plate is used to perform the exposure on the photoresist, and wherein fully light transmissive regions of the halftone mask plate correspond to the via hole sub-regions, light semi-transmissive regions of the halftone mask plate correspond to the strip-shaped electrode regions, and light non-transmissive regions of the halftone mask plate correspond to the spacer regions.

12. The method for manufacturing an array substrate according to claim 11, wherein after the step of performing an exposure and a development on the photoresist and before the step of performing an ashing process on the photoresist, the method for manufacturing an array substrate further includes steps of:
    performing an etching process on the via hole sub-regions of the insulation layer to form the via holes so that a part of the drains of the thin film transistors is exposed.

13. The method for manufacturing an array substrate according to claim 12, wherein the step of forming a pattern including strip-shaped electrodes on the strip-shaped electrode regions of the insulation layer includes:
    forming a layer of pixel electrode material which is connected to the drains of the thin film transistors through the via holes; and
    forming a pattern including pixel electrodes by a patterning process.

14. The method for manufacturing an array substrate according to claim 6, wherein after the step of performing an exposure and a development on the photoresist and before the step of performing an ashing process on the photoresist, the method for manufacturing an array substrate further includes steps of:
    performing an etching process on the via hole sub-regions of the insulation layer to form the via holes so that a part of the drains of the thin film transistors is exposed.

15. The method for manufacturing an array substrate according to claim 14, wherein the step of forming a pattern including strip-shaped electrodes on the strip-shaped electrode regions of the insulation layer includes:
    forming a layer of pixel electrode material which is connected to the drains of the thin film transistors through the via holes; and
    forming a pattern including pixel electrodes by a patterning process.

16. The method for manufacturing an array substrate according to claim 5, wherein the strip-shaped electrodes include pixel electrodes or common electrodes.

17. The method for manufacturing an array substrate according to claim 1, wherein the strip-shaped electrodes include pixel electrodes or common electrodes.

18. The method for manufacturing an array substrate according to claim 1, wherein the insulation layer includes silicon nitride.

* * * * *